United States Patent [19]
McLaughlin et al.

[11] Patent Number: 5,508,962
[45] Date of Patent: Apr. 16, 1996

[54] APPARATUS AND METHOD FOR AN ACTIVE FIELD PLATE BIAS GENERATOR

[75] Inventors: Daniel F. McLaughlin, Dallas; Darryl G. Walker, Sugar Land, both of Tex.

[73] Assignee: Texas Instruments Incorporated, Dallas, Tex.

[21] Appl. No.: 267,701

[22] Filed: Jun. 29, 1994

[51] Int. Cl.$^6$ ........................................ G11C 11/24
[52] U.S. Cl. ................ 365/189.09; 365/149; 327/530
[58] Field of Search ................ 365/149, 189.09; 307/296.1, 296.2, 296.3; 327/530, 534, 544

[56] References Cited

U.S. PATENT DOCUMENTS

| | | | |
|---|---|---|---|
| 4,799,193 | 1/1989 | Horiguchi et al. | 365/149 |
| 5,079,743 | 1/1992 | Suwa et al. | 365/149 |
| 5,253,205 | 10/1993 | Eaton, Jr. | 365/189.06 |
| 5,276,651 | 1/1994 | Sakamoto | 365/226 |
| 5,317,532 | 5/1994 | Ochii | 365/149 |

Primary Examiner—David C. Nelms
Assistant Examiner—Son Dinh
Attorney, Agent, or Firm—Rich Donaldson; Leo Heiting; William W. Holloway

[57] ABSTRACT

The plate voltage for a Dynamic Random Access Memory storage cell array is provided by two amplifiers. The first amplifier operates at a relatively low power level and compensates for leakage in the storage cell array, the compensation initiated by a departure of the plate from a nominal value which exceeds a preselected amount. The second amplifier operates at a higher power level and provides compensation for transients in the plate voltage resulting from the charging and discharging of the storage cells. Because the transients occur when the storage cells are accessed, the second amplifier is enabled only when a group of storage cells is accessed. In addition to operating at a higher power level, the second amplifier is more sensitive and responds to smaller excursions from the nominal voltage. Both the first and the second amplifiers have separate driver circuits for responding to excursions above and for responding to excursions below the nominal voltage.

23 Claims, 2 Drawing Sheets

APPARATUS AND METHOD FOR AN ACTIVE FIELD PLATE BIAS GENERATOR

BACKGROUND OF THE INVENTION

1. Field of the Invention

This invention relates generally to semiconductor memory units and, more particularly, to dynamic random access memory (DRAM) units. A DRAM unit requires a relatively stable plate voltage for the storage cells to prevent incorrect identification of the logic state represented by the storage cell. The present invention provides for a stable plate voltage even under conditions that can result in plate voltage transients.

A dynamic random access memory (DRAM) includes an array of storage cells 10, a schematic diagram of a storage cell being included as FIG. 1. Each storage cell typically includes a gate element 12 and a capacitor element 14. A control terminal of gate element 12 is coupled to control line 8. Control line 8 is, in addition, typically coupled to control terminals of gate elements of a multiplicity of storage cells, the multiplicity of storage cells coupled to control line 8 generally forming a row in the DRAM unit array of storage cells. Each gate element is typically coupled between one terminal of capacitor 14 and a sense line 6. The sense line 6 is coupled to a column of storage cells 10 in the DRAM memory array of storage cells. The second terminal of capacitor 14 is coupled to a plate voltage terminal 16.

A logic state stored in the storage cell 10 is represented by the amount of charge stored on, and therefore the voltage across, capacitor 14. In the storage or write mode of the storage cell, the control line 8 is activated thereby enabling the gate 12. The logic state to be stored is determined by the charge stored on the capacitor as a result of potential level of sense line 6. In the retrieve or read mode of operation of the storage cell, the control line 8 enables the gate element 12 and the potential applied to the sense line 6 identifies the logic state stored on the capacitor. In DRAM memory arrays, the charge stored on the plates of capacitor 14 can gradually leak off, thereby compromising the ability of apparatus coupled to sense line 6 to determine the logic state of storage element 10, i.e., identify the correct voltage level applied to line 6 when control line 8 is activated. To avoid the degradation of the logic signal, the storage cells 10 in the array are periodically refreshed, i.e., the logic state (or charge on the capacitor) of the storage cell is detected and the charge on the capacitor 14 is returned to a non-degraded value. The non-degraded value of charge thereby provides a correct identification of the logic state by sense line 6 upon activation of the control line 8. (The charge representing the logic level in a storage cell 10 can also be degraded when the storage cell is accessed in the read or retrieve mode of operation and the degraded charge must be restored immediately following the operation resulting in the storage cell access when the logic level is to be maintained in the storage cell 10).

It will be clear that whenever the capacitor 14 is charged (or discharged), a perturbation is transmitted (by capacitive coupling) to the plate voltage terminal 16. A perturbation in the plate voltage can be communicated to other storage cells and can compromise the identification of the logic state represented by the charge stored on the capacitor. In general, because of the large number of storage cells, the perturbation in the plate voltage will be small unless a substantial number of storage cells are accessed simultaneously. Moreover, during initiation of the DRAM unit, when a group of the storage cells have not yet had a definite logic signal stored therein, the charges of the capacitors of that group can be at an intermediate value, and when definite logic signals are stored therein, such as in a refresh cycle, the identification of the logic signals that have already been stored in other groups of storage cells can be compromised through the capacitive coupling.

To minimize the effect of the capacitive coupling of charging a storage cell capacitor on the plate voltage, the size of the energizing source providing power to the array of storage cells can be increased. However, the use of a power supply which is capable of providing the requisite power in all circumstances of large transient conditions is inefficient. In addition, it is desirable to have the power supplied to the plate operate in only an intermittent fashion. The constant operation of the plate supply can result in unacceptable power dissipation, i.e., by the standby current.

A need has therefore been felt for apparatus and an associated method to provide an energizing source for the plate voltage for the storage cells of DRAM units which maintains the array plate voltage within predetermined limits without requiring excessive apparatus. The apparatus and associated method in addition should minimize the effect of plate voltage transients resulting from capacitive coupling of the storage cells on the plate voltage.

SUMMARY OF THE INVENTION

The present invention solves one or more of the aforementioned problems with the prior art, according to one embodiment, by providing two amplifiers to energize the plate voltage of the storage cell array. The first amplifier maintains the plate voltage within predetermined limits as long as the memory is active and generally compensates for the leakage of charge across the capacitors. The second amplifier is activated when the storage cells are accessed and generally compensates for transients voltages resulting from the access of the storage cells. In addition, the second amplifier is more sensitive than the first amplifier and, in order to respond to voltage fluctuations in a timely manner, can provide more power.

These and other features of the present invention will be understood upon reading of the specification in view of the figures.

DESCRIPTION OF THE PREFERRED EMBODIMENT(S)

Figure 1:
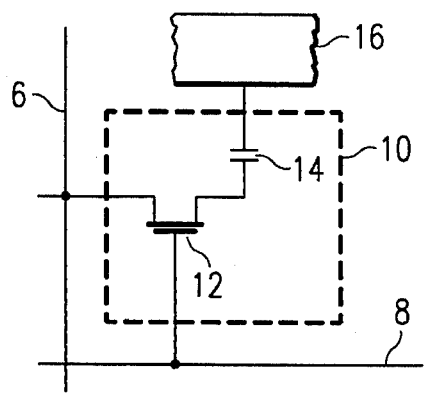
FIG. 1 is a schematic diagram of a storage cell in a DRAM unit according to the prior art.

Detailed Description of the Drawings FIG. 1 has been described with respect to the related art.

Figure 2:
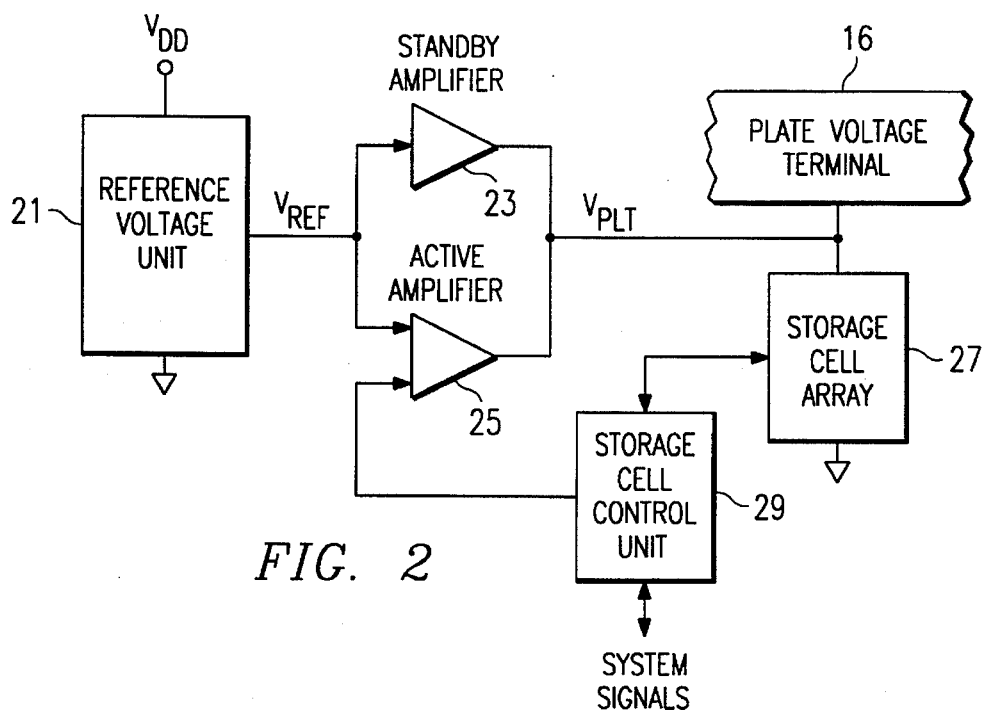
FIG. 2 is a block diagram of the apparatus for providing a constant plate voltage to the storage cell array according to the present invention.

Referring next to FIG. 2, a block diagram of the energizing source for the plate voltage of a DRAM unit according to the present invention is shown. The reference voltage unit 21 applies a reference voltage to an input terminal of standby amplifier 23 and to an input terminal of active amplifier 25. The output terminals of standby amplifier 23 and active amplifier 25 are coupled to plate voltage terminal 16. The plate voltage terminal is coupled to storage cell array 27. The storage cell array control unit 29 applies signals to and receives signals from the storage cell array 27 and applies a timing signal to an input terminal of active amplifier 25. The storage cell control unit 29 retrieves logic signals from the storage cell array 27 and stores logic signals in storage cell array 27 in response to signals from the associated system. In addition, the storage cell control unit 29 controls the refresh of the logic signals stored in the storage array. Sense line 6 and control line 8 are coupled to the storage cell control unit.

Figure 3:
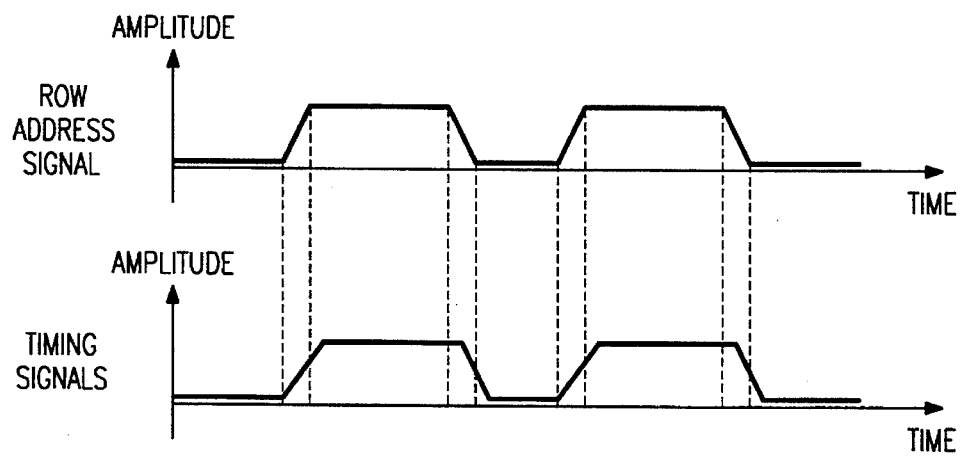
FIG. 3 is a timing diagram showing the relationship of the activation of the second amplifier to the storage cell array access.

Referring to FIG. 3, the relationship of the timing signal applied by the storage cell control unit 29 to the active amplifier 25, as shown in FIG. 2, is illustrated. When a selected group of storage cells in storage cell array 27 is addressed, a row address signal (RAS), is used to address an entire row storage cells. The column address signals (CAS) are then used to determine which subgroup of storage cells in the row of storage cells selected by the RAS signal for either writing data into the selected storage cells, reading data from the selected storage cells, or refreshing the row of storage cells has been selected. Thus, the RAS signal indicates a charging or discharging of a row of storage cell capacitors of the storage cell array 27. Thus, the RAS signal is correlated with the possible perturbation of the plate voltage resulting from manipulation of the storage cells, i.e., through the capacitive coupling. The timing signal is generated by the RAS signal and enables the active amplifier 25. The active amplifier 25 is then available to compensate for the effect on the plate voltage of transient signals resulting from the charging or discharging of the storage cell capacitors. (The standby amplifier 23 is typically enabled in the preferred embodiment).

Figure 4:
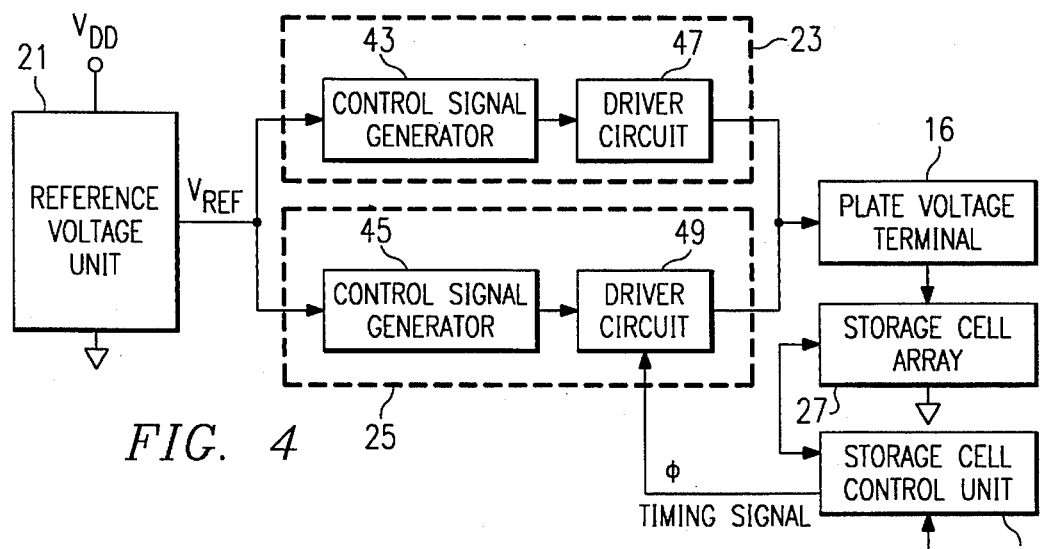
FIG. 4 is a detailed block diagram of the preferred embodiment of the plate voltage energizing unit according to the present invention.

Referring to FIG. 4, a more detailed block diagram, as compared to FIG. 2, of the preferred embodiment of the present invention is shown. A reference voltage unit 21, coupled between the power supply voltage $V_{dd}$ and ground terminal, provides a reference voltage $V_{ref}$. In the preferred embodiment, the reference voltage is $V_{dd}/2$. This reference voltage $V_{ref}$ is the approximate value of the plate voltage $V_{plt}$ for the array of storage cells 27. The reference voltage (i.e., $V_{dd}/2$ in the preferred embodiment although other reference voltages are possible) is applied to a control signal generator 43 portion of the standby amplifier 23 and to a control signal generator 45 portion of active amplifier 25. The output signal(s) from control signal generator 43 are applied to a driver circuit 47 portion of standby amplifier 23, while the output signals from control signal generator 45 are applied to the driver circuit 49 portion of active amplifier 49. The output signals from driver circuit 47 and driver circuit 49 are applied to plate voltage terminal 16 and establish the plate voltage $V_{plt}$ applied to storage array 27. The storage cell control unit 29 applies the timing signal to the driver circuit 49

Figure 5:
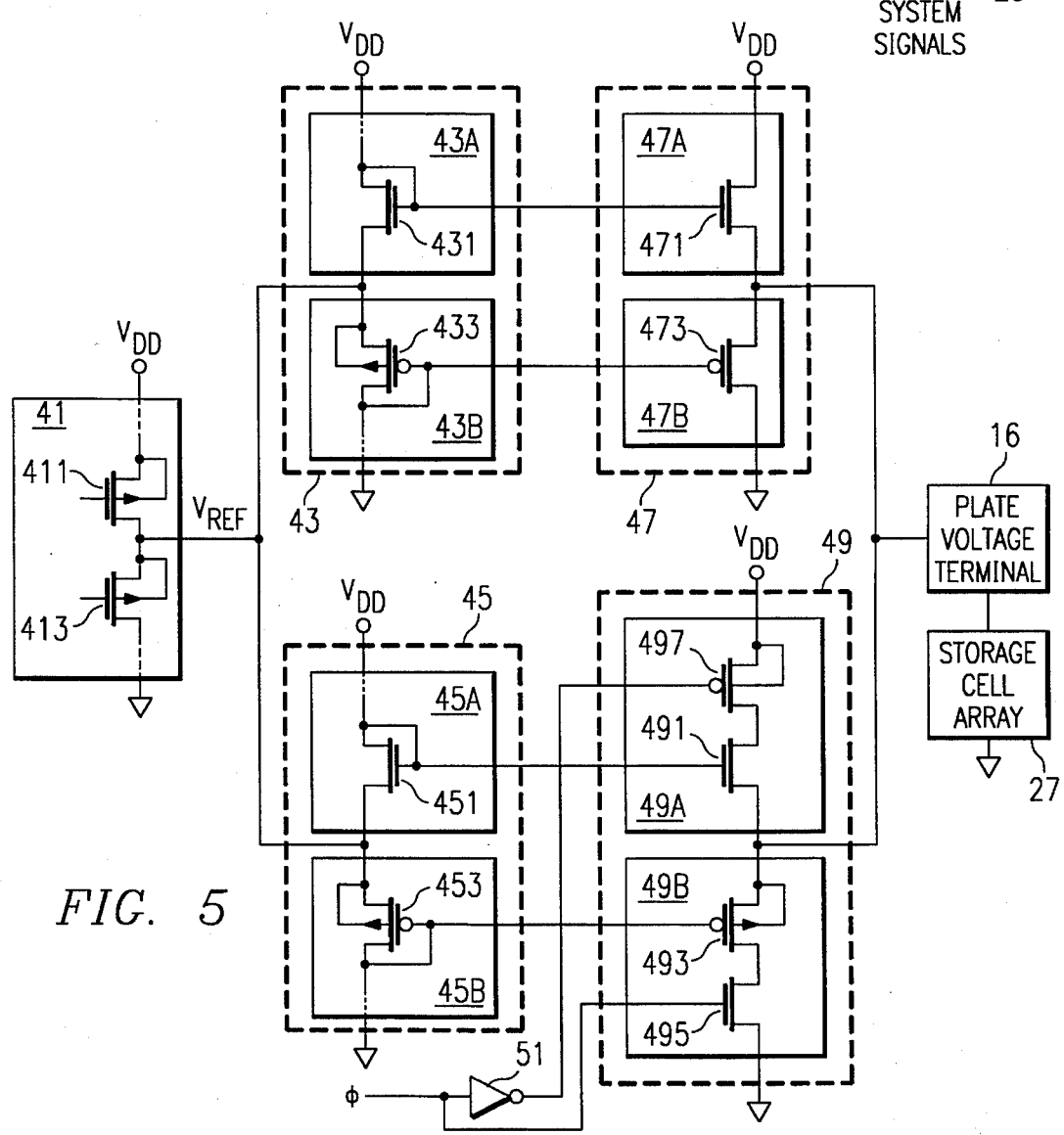
FIG. 5 is a block diagram of the preferred embodiment with selected components displayed providing a more detailed explanation of the operation of the present invention.

Referring next to FIG. 5, the block diagram shown in FIG. 4 has been expanded to include some of the important implementing components. The reference voltage unit 21 includes a series of (voltage dividing) transistors of which two, transistor 411 and transistor 413, are shown. The reference voltage $V_{ref}$ is established at the connection between transistor 411 and transistor 413. As indicated above, the reference voltage $V_{ref}$ is approximately $V_{dd}/2$ in the preferred embodiment. In the preferred embodiment of the present invention, control signal generator 43 portion of the active amplifier 23 includes two subunits, the first subunit 43A is coupled the reference voltage terminal and the supply voltage $V_{dd}$, while the second subunit 43B is coupled between the reference voltage terminal and the ground terminal. The first subunit 43A includes of a plurality of series-connected integrated components. One of the components is n-channel transistor 431, transistor 431 being coupled in a diode configuration and having a first (cathode) terminal coupled to the reference voltage terminal. The second subunit 43B of control signal generator 43 includes a plurality of series-connected, integrated components coupled between the reference voltage and the 10 ground potential. One of the components of subunit 43B is n-channel transistor 433 coupled in a diode configuration and having a first (anode) terminal coupled to the reference voltage terminal. Similarly, the control signal generator 45 of the active amplifier 25 is divided into two subunits, 45A and 45B. The control signal generator subunit 45A is comprised of a plurality of series-connected, integrated components coupled between power supply voltage and reference subunit 45A including a diode-coupled n-channel transistor 451 having a first (cathode) terminal coupled to the reference voltage terminal. The control signal generator subunit 45B is comprised of a plurality of series-connected, integrated components coupled between the reference voltage terminal and the ground potential. The subunit 45B includes a diode coupled p-channel transistor 453 having a first (anode) terminal coupled to the reference voltage terminal. The standby driver circuit 47 is divided into two driver circuit subunits, 47A and 47B. Standby driver circuit subunit 47A includes a n-channel transistor 471 coupled between the supply voltage Vdd and the plate voltage terminal 16 and having a gate terminal coupled to a second (anode) terminal of transistor 431. Standby driver circuit subunit 47B includes a p-channel transistor 473 coupled between the plate voltage terminal 16 and the ground terminal, the gate terminal of transistor 473 being coupled to a second (cathode) terminal of diode-coupled transistor 433. The active driver circuit 49 is divided into two subunits, 49A and 49B. Subunit 49A includes a p-channel transistor 497 having first terminal coupled to supply voltage Vdd and a second terminal coupled to a first terminal of n-channel transistor 491. The second terminal of transistor 491 is coupled to the plate voltage terminal 16. The subunit 49B includes a p-channel transistor 493 having a first terminal coupled to the plate voltage terminal 16 and a second terminal coupled to a first terminal of n-channel transistor 495. A second terminal of transistor 495 is coupled to the ground terminal. A second (anode) terminal of transistor 431 is coupled to a gate terminal of transistor 471, while a second (cathode) terminal of transistor 433 is coupled to the gate terminal of transistor 473. A second (anode) terminal of transistor 451 is coupled to a gate terminal of transistor 491 while a cathode terminal of transistor 453 is coupled to a gate terminal of transistor 493. The timing signal is applied to the gate terminal of transistor 495. The timing signal is applied to an input terminal of inverting amplifier 51 while the output signal of inverting amplifier 51 is applied to a gate terminal of transistor 497.

OPERATION OF THE PREFERRED EMBODIMENT

The operation of the preferred embodiment can be understood as follows. The standby amplifier 23 is continuously ready to charge or discharge current from the plate terminal, thereby controlling the voltage on across the storage cell array 27. The driver circuit 47 for the standby amplifier consists of two subunits, one to discharge the terminal and one to charge the plate terminal. Two subunits, used in the manner described, minimizes the power dissipation by the standby driver unit. The standby driver circuit subunit 47A will charge the plate terminal 16 when the plate terminal voltage is below the value $V_{ref}+ V_{tr431} -Vt_{tr471}$ (where $V_{tr431}$ is the voltage drop across transistor 431 and $Vt_{tr471}$ being the threshold voltage of transistor 471), i.e., by causing transistor 471 to become conducting. The standby driver circuit subunit 47B will discharge the plate terminal when the plate terminal voltage is above $Vref-Vt_{tr433}30 |Vt_{tr473}|$ (where $Vt_{tr433}$ is the voltage drop across transistor 433 and $Vt_{tr473}$ being the threshold voltage of transistor 473), i.e., by causing transistor 473 to become conducting. The standby amplifier 23 is designed to compensate for the steady leakage and minor changes of the plate voltage. However, the standby driver circuits 47 are not designed to have the capacity to respond to transients in storage cell array 27.

The transients in the storage cell array 27 are compensated for by the active amplifier 25. As with the standby amplifier 23, the active amplifier 27 is partitioned into two subunits, subunit 49A and subunit 49B. Subunits 49A is enabled by the timing_ signal being applied to transistor 497, while subunit 49B is enabled by the application of the timing signal to transistor 495. As has been described with reference to FIG. 2, the timing signal is generated by the RAS signal or an equivalent activation clock signal. When subunits 49A and 49B are enabled by the timing_ and the timing signal respectively, then subunit 49A will charge the plate terminal when the plate voltage is less than $V_{ref}+ V_{tr451}-Vt_{tr491}$ ($V_{tr451}$ being the voltage drop across transistor 451 and $Vt_{tr491}$ being the threshold voltage of transistor 491) and subunit 49B will discharge the plate terminal when the plate voltage is above $V_{ref}-V_{tr453}+|Vt_{tr493}|$ (where $V_{tr453}$ is the voltage drop across transistor 453 and $Vt_{tr493}$ being the threshold voltage of transistor 493). In addition, in the preferred embodiment, the parameters in the fabrication of transistors 451 and 453 as compared to the parameters of transistors 431 and 433 result in a voltage drop across transistors 451 and 453 that is less than the voltage drop across transistors 431 and 433. In other words, the sensitivity of the active driver amplifier 25 is greater than that of the standby amplifier 23.

As will be clear to those skilled in the art, the reference voltage $V_{ref}$ can be selected to be a voltage other than Vdd/2. Similarly, the voltage dividing network of establishing voltage levels can be comprised of series-coupled resistors.

The foregoing description is intended to describe the preferred embodiment and is not meant to limit the scope of the invention. The scope of the invention is to be limited only by the following claims. Many variations will be apparent to those skilled in the art which are encompassed by the spirit and scope of the present invention.

What is claimed is:

1. An energizing source for energizing a plate voltage terminal of an array of storage cells, said energizing source comprising:

a reference voltage unit determining a reference voltage;

a first amplifier having said reference voltage applied to an input terminal, said amplifier having an output terminal coupled to said plate voltage terminal, said first amplifier increasing a plate voltage when said plate voltage is below a first preselected value relative to said reference voltage, said first amplifier decreasing said plate voltage when said plate voltage exceeds a second preselected value relative to the reference voltage; and a second amplifier having siad reference voltage applied to an input terminal, said second amplifier having an output terminal coupled to said plate VOltage terminal, said second amplifier having a terminal for receiving an enabling signal, said second amplifier increasing said plate voltage when said plate voltage is below said reference voltage by a third preselected value, said second amplifier decreasing said plate voltage when said plate is above said reference voltage by a fourth preselected value.

2. The energizing source of claim 1 wherein said enabling signal is derived from an access signal resulting in the access of a group of storage cells in said storage cell array.

3. The energizing source of claim 1 wherein said reference voltage is a fraction of a supply voltage for said amplifiers.

4. The energizing source of claim 1 wherein said first, said second, said third, and said fourth preselected values are determined by parameters of a first, a second, a third, and a fourth transistor.

5. The energizing source of claim 4 wherein said parameters determine a voltage drop across an associated transistor.

6. The energizing source of claim 5 wherein said first preselected value is greater than said third preselected value, and said second preselected value is greater than said fourth preselected value.

7. The energizing source of claim 1 wherein said first amplifier includes:

a first driver circuit for increasing said plate voltage, and a second driver circuit for decreasing said plate voltage;

wherein said second amplifier includes:

a first driver circuit for increasing said plate voltage; and a second driver circuit for decreasing said plate voltage.

8. A Dynamic Random Access Memory (DRAM) unit comprising:

a storage cell array, said storage cell unit including:

a storage cell unit, said storage cell unit coupled to a plate voltage terminal, said plate voltage terminal providing a plate voltage for said storage cell array, and a storage cell access unit for accessing predetermined groups of storage cells in said storage cell array;

an energizing circuit for applying a voltage to said plate voltage terminal, said energizing circuit including:

a reference voltage source;

a first amplifier coupled to said reference voltage source and said plate voltage terminal, said first amplifier increasing said plate terminal voltage when said plate voltage is a first predetermined value below said reference voltage, said first amplifier decreasing said plate voltage when said plate voltage is above a second predetermined value above said plate voltage; and a second amplifier coupled to said reference voltage and said plate voltage terminal and responsive to an enabling signal, said second amplifier increasing said plate voltage when said plate voltage is a predetermined value below said reference voltage and said enabling signal is present, said second amplifier decreasing said terminal voltage when said plate voltage is a predetermined value above said reference voltage and said enabling signal is present.

9. The DRAM unit of claim 8 wherein said enabling signal is generated by an access of said storage cell array by said storage cell access unit.

10. The DRAM unit of claim 9 wherein said reference voltage is a fraction of a power supply voltage providing power for said DRAM unit.

11. The DRAM unit of claim 9 wherein said first amplifier includes:

a first driver circuit for increasing said plate voltage, and a second driver circuit for decreasing said plate voltage; and wherein said second amplifier includes:

a first driver circuit for increasing said plate voltage, and a second driver circuit for decreasing said plate voltage.

12. The DRAM unit of claim 8 wherein said first predetermined value is greater than said third predetermined value and said second predetermined value is greater than said fourth predetermined value.

13. The DRAM unit of claim 8 wherein said DRAM unit is fabricated using integrated circuit techniques, said first predetermined value, said second predetermined value, said third predetermined value, and said fourth predetermined value being determined by a voltage drop across associated transistors.

14. A dynamic random access integrated circuit memory comprising;

a storage cell array;

a access circuit coupled to said storage cell array for accessing selected storage cells; and an energizing circuit for controlling a plate terminal voltage, said plate terminal voltage applied to said storage cell array, said energizing circuit comprising:

a first amplifier increasing said plate terminal voltage when said plate terminal voltage is below a first predetermined value, said first amplifier decreasing said plate voltage when said plate voltage is above a second predetermined value, and a second amplifier increasing said plate voltage when said plate voltage is below a third predetermined value and said access circuit is accessing said storage cell array, said second amplifier decreasing said plate voltage when said plate voltage is above a fourth predetermined value and said access circuitry is accessing said storage cell array.

15. An energizing circuit for providing a plate voltage for a storage array of a dynamic random access memory display, said circuit comprising:

a first amplifier for returning said plate voltage to a first predetermined voltage range when said plate voltage is outside of said first predetermined range, wherein said first predetermined voltage range is determined relative to a reference voltage; and a second amplifier for compensating for plate voltage transients by returning said plate voltage a second predetermined range when plate voltage is outside of said second predetermined range and said storage array is being accessed, wherein said second predetermined voltage range is determined relative to said reference voltage.

16. The energizing circuit of claim 15 wherein said plate voltage transients are a result of accesses to said storage cell array.

17. The energizing circuit of claim 15 wherein said second amplifier is activated only when access is made to said storage cell array.

18. The energizing circuit of claim 17 wherein said second amplifier is activated in response to a control signal, said control signal being generated by apparatus controlling access to said storage cell array.

19. A method for regulating the plate voltage of a storage cell array of a dynamic random access memory unit, said method comprising the steps of:

when said plate voltage is outside a first predetermined range, activating a first amplifier to return said plate voltage to said predetermined range wherein said first predetermined voltage range is determined relative to a reference voltage; and when said plate voltage is outside a second predetermined range and said storage cell array is being accessed by said external circuits, activating a second amplifier to return said plate voltage to said second predetermined range wherein said second predetermine voltage range is determined relative to said reference voltage.

20. A dynamic random access memory unit comprising:

a storage cell array, said storage cell including a plate voltage terminal;

access circuits for accessing selected storage cells of said storage cell array; and a voltage source for applying a voltage to said plate voltage terminal of said storage cell array, said voltage source including:

a first amplifier for returning said plate terminal voltage to a first predetermined voltage range when said plate terminal voltage is outside said first predetermined voltage range, said first predetermined voltage range being determined relative to a reference voltage; and a second amplifier for returning said plate terminal voltage to a second predetermined range when when storage cells are accessed, said second predetermined voltage range being determined relative to said reference voltage.

21. The memory unit of claim 20 wherein said second amplifier is activated by a control signal, said control signal being applied to said second amplifier by said access circuits when a plurality of said storage cells are said access circuits.

22. The memory unit of claim 20 wherein said first and second voltage ranges are determined by parameters of transistors components.

23. The memory unit of claim 20 wherein said first and said second amplifier each include first and second amplifier units, said first amplifier unit of said first amplifier and said first amplifier unit of said second amplifier operating to increase said plate terminal voltage falls below said first and said second predetermined ranges respectively, said second amplifier unit of said first amplifier and said second amplifier unit of said second amplifier operating to decrease said plate terminal voltage when said plate terminal voltage rises above said first and said second predetermined ranges respectively.

* * * * *